(12) United States Patent
Shigenobu et al.

(10) Patent No.: US 6,232,804 B1
(45) Date of Patent: May 15, 2001

(54) SAMPLE HOLD CIRCUIT HAVING A SWITCH

(75) Inventors: Takeshi Shigenobu; Masao Ito; Toshio Kumamoto, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/413,751

(22) Filed: Oct. 6, 1999

(30) Foreign Application Priority Data

Jun. 10, 1999 (JP) .................................................. 11-163928

(51) Int. Cl.$^7$ .................................................. G11C 27/02
(52) U.S. Cl. ................................................................ 327/94
(58) Field of Search ................................... 327/91, 93, 94, 327/96, 90; 341/122

(56) References Cited

U.S. PATENT DOCUMENTS

| | | | |
|---|---|---|---|
| 4,318,080 | * 3/1982 | Yoshida | ............................. 340/146.3 |
| 4,767,997 | * 8/1988 | Nielsen | .................................. 327/91 |
| 5,500,612 | * 3/1996 | Sauer | .................................... 327/91 |
| 5,861,829 | * 1/1999 | Sutardja | ............................... 341/122 |
| 5,877,719 | * 3/1999 | Matsui et al. | ........................ 341/155 |

FOREIGN PATENT DOCUMENTS

| | | |
|---|---|---|
| 61-30121 | 2/1986 | (JP) . |
| 63-191730 | 12/1988 | (JP) . |
| 7-212202 | 8/1995 | (JP) . |
| 10-500820 | 1/1998 | (JP) . |

* cited by examiner

*Primary Examiner*—My-Trang Nuton
(74) *Attorney, Agent, or Firm*—Burns, Doane, Swecker & Mathis, LLP

(57) ABSTRACT

In a sample hold circuit (6, 50, 60) capable of relaxing a dependency of a voltage of an analogue input signal on an ON resistance of a switch (2). In the sample hold circuit (6, 50, 60), plural reference voltages VrefN are supplied, and unit switches (11e) forming the switch (2) are selectively activated (an ON state) based on a comparison results (whether or not the voltage of the analogue input signal is greater than each reference voltage) from plural comparison circuits (13e) whose operations are performed based on the voltage of the analogue input signal (1).

19 Claims, 9 Drawing Sheets

Vref1<Vref2<Vref3<Vref4<Vref5

DIFFERENTIAL AMPLIFIER

FIG.9

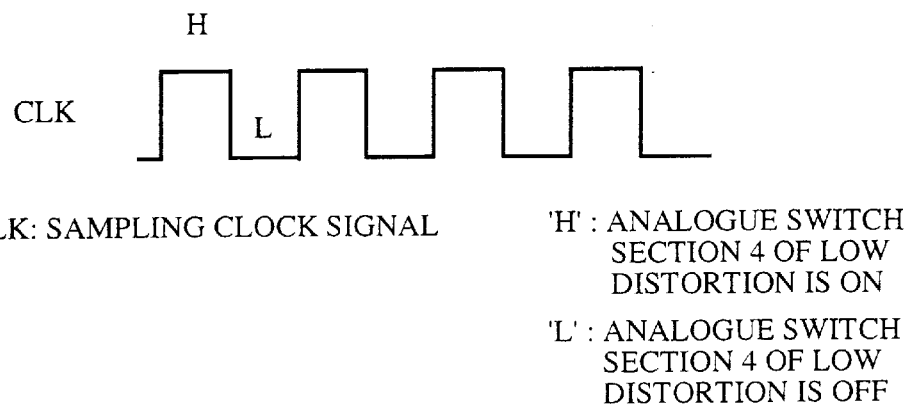

CLK: SAMPLING CLOCK SIGNAL

'H': ANALOGUE SWITCH SECTION 4 OF LOW DISTORTION IS ON

'L': ANALOGUE SWITCH SECTION 4 OF LOW DISTORTION IS OFF

FIG.10

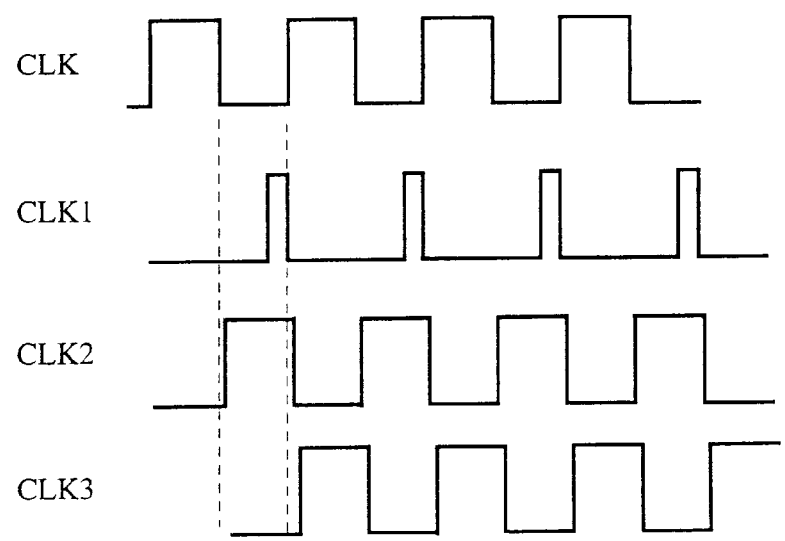

CLK: SAMPLING CLOCK SIGNAL, 'H' INDICATES ANALOGUE SWITCH SECTION 4 OF LOW DISTORTION IS ON, 'L' INDICATES ANALOGUE SWITCH SECTION 4 OF LOW DISTORTION IS OFF

CLK1: CLOCK SIGNAL FOR AUTO ZERO, 'H' INDICATES AUTO ZERO

CLK2: CLOCK SIGNAL FOR INPUT Vrefi, 'H' INDICATES Vrefi INPUT

CLK3: CLOCK SIGNAL FOR INPUT SIGNAL, 'H' INDICATES INPUT SIGNAL IS ON

SAMPLE HOLD CIRCUIT HAVING A SWITCH

BACKGROUND OF THE INVENTION

1. Field of the Invention

The present invention relates to a sample hold circuit incorporating a switch of a low distortion capable of reducing a distortion of an output signal by changing an ON resistance of the switch to which an analogue input signal is supplied.

2. Description of the Related Art

FIG. 1 is a circuit diagram showing a configuration of a conventional sample hold circuit. In FIG. 1, the reference number 121 designates a MOS transistor switch, and 122 denotes a sample hold processing section. Thus, the conventional sample hold circuit comprises the MOS transistor 121 for sampling an analogue input signal and the sample processing section 122 for sampling the analogue input signal.

Next, a description will be given of the operation of the conventional sample hold circuit shown in GIG.1.

When the conventional sample hold circuit performs sampling of analogue input signals, the ON resistance R of the MOS transistor switch 121 is proportional to the inverted value of a value obtained by subtracting a voltage difference $V_{GS}$ between a gate terminal G and the source terminal S of the MOS transistor switch 121 from a value of a threshold voltage $V_{th}$ of the MOS transistor switch 121. For example, the ON resistance can be expressed by the following equation (1):

$$R = 1/\beta(V_{GS} - V_{th}) \qquad (1)$$

where $\beta = \mu_0 W/L$, $\mu_0$ is a gain coefficient, W is a channel width, and L is a channel length.

Accordingly, when the conventional sample hold circuit shown in FIG. 1 samples the analogue input signal through the MOS transistor switch 121, the ON resistance value R of the switch is changed according to the voltage of the analogue input signal. Thereby, the output signal held by and output from the MOS transistor switch 121 includes a signal distortion. This signal distortion generated in the conventional sample hold circuit shown in FIG. 1 introduces a drawback that a signal to noise ratio (S/N ratio) is decreased. The S/N ratio is used as an index of the performance of the A/D converter.

In order to eliminate the signal distortion in the output wave from the MOS transistor switch 121 in the conventional sample hold circuit, the following methods are used.

In a first method, a voltage amplitude Vdd of the clock signal CLK to be supplied to the gate terminal G of the MOS transistor switch 121 is set to a large value. Thereby, the dependency of the ON resistance R of the MOS transistor switch 121 on the input voltage of the analogue input signal is proportional to the inverted value of the voltage amplitude squared $VDD^2$ of the clock signal CLK. This conventional method can decrease the signal distortion of the output wave of the sample hold circuit.

In a second method, a circuit to overlap the input signal to the clock signal CLK to be supplied to the gate terminal G of the MOS transistor switch 121 is introduced so that a voltage difference between the gate terminal G and the source terminal S of the MOS transistor switch 121 becomes a constant value.

In a third method, a size of the MOS transistor switch 121 is increased. This method means that the value β in the above equation (1) is increased. Because the dependency of the ON resistance T of the MOS transistor switch on the input voltage of the analogue input signal is inversely proportional to the value β, the distortion of the output signal is decreased.

In a fourth method, a value $V_{th}$ of the threshold voltage of the MOS transistor switch is decreased.

In conventional sample hold circuits, one of the above methods, or a combination of the above first to fourth methods are used in order to decrease the distortion of the output wave from the MOS transistor switch incorporated in the sample hold circuit.

Because the conventional sample hold circuit has the above configuration, according to the recent improvements of MOS transistors in size, integration, and performance, it is required to use the voltage of 3 V in 0.5 μm process in order to keep a withstanding voltage at a gate terminal, the voltage of approximately 3V in 0.35 μm process, and the voltage of 2V or less in 0.2 μm process. This means the voltage of the power source tends to shift a lower voltage. In this case, the distortion of the output signal generated by the ON resistance of the MOS transistor switch in the sample hold circuit becomes a large factor. Thereby, the distortion of the output signal greatly limits an allowed range of the input voltage in the A/D converter. In the tendency toward a low voltage of the power source, the conventional first and second methods described above can not eliminate the adverse effect by the distortion of the output wave from the MOS transistor switch in the sample hold circuit while keeping the withstanding voltage at the gate terminal. In addition, in the low voltage of the power source, the third and fourth conventional methods described above can not eliminate completely the adverse effect by the distortion of the output wave from the MOS transistor switch in the conventional sample hold circuit when this MOS transistor switch enters ON.

SUMMARY OF THE INVENTION

Accordingly, an object of the present invention is, with due consideration to the drawbacks of the conventional technique, to provide a sample hold circuit using a switch capable of decreasing the adverse effect by the distortion of the output wave of the sample hold circuit even if a power source of a low voltage is used.

In accordance with a preferred embodiment of the present invention, a sample hold circuit comprises an input voltage decision section for comparing an analogue input signal with each reference signal having a predetermined voltage, an analogue switch section of a low distortion having a switch of a constant resistance value for processing so that an ON resistance of the analogue switch section for inputting the analogue input signal has a constant value in spite of a level of an input voltage of the analogue input signal according to a decision result from the input voltage decision section, and a sample hold processing section for sampling the analogue input signal from the analogue switch section of a low distortion.

In the sample hold circuit as another preferred embodiment according to the present invention, the input voltage decision section comprises a reference voltage system comprising a plurality of means for generating and supplying a plurality of reference voltages each having a predetermined voltage, a comparison block comprising a plurality of comparison circuits, corresponding to the plurality of reference voltages, for comparing the analogue input signal with the plurality of reference voltages, and a switch off block comprising a plurality of blocks corresponding to the plurality of reference voltages. In the sample hold circuit, the switch of a constant resistance value comprising a base switch and a plurality of unit switches corresponding to the plurality of comparison circuits, and each of the plurality of reference voltages is weighted, the plurality of comparison circuits compare the input voltage the analogue input signal with the plurality of reference voltages when the switch of a constant resistance value enters ON, and the plurality of unit switches are selectively activated by supplying output signals, obtained by logical AND operation between the comparison results from the plurality of comparison circuits and a clock signal to be supplied to the analogue switch of a low distortion, to a gate terminal of each unit switch so that a synthetic ON resistance of an ON resistance of the base switch and ON resistances of the plurality of unit switches becomes a constant value according to the input voltage of the analogue input signal.

In the sample hold circuit as another preferred embodiment according to the present invention, each of the plurality of blocks forming the switch off block comprises a selection circuit made up of a MOS transistor, and an ON/OFF operation of each unit switch forming the switch of a constant resistance value is performed based on an output signal from each selection circuit.

In the sample hold circuit as another preferred embodiment according to the present invention, the comparison block and the switch off block in the input voltage decision section comprise a plurality of comparison circuits each comprising a differential amplifier or a chopper type comparison circuit, and the ON/OFF operation of each unit switch forming the switch of a constant resistance value is performed based on an output signal from each comparison circuit.

In the sample hold circuit as another preferred embodiment according to the present invention, each unit switch forming the unit switch system is made up of one of a n-channel type MOS transistor, a p-channel type MOS transistor, and a CMOS transistor.

BRIEF DESCRIPTION OF THE DRAWINGS

These and other objects, features, aspects and advantages of the present invention will become more apparent from the following detailed description of the present invention when taken in conjunction with the accompanying drawings, in which:

FIG. 9 is an explanation diagram showing a clock signal CLK to be supplied to an analogue switch section of a low distortion;

FIG. 10 is an explanation diagram showing control clock signals to control the operation of the chopper type comparison circuit;

DESCRIPTION OF THE PREFERRED EMBODIMENTS

Other features of this invention will become apparent through the following description of preferred embodiments which are given for illustration of the invention and are not intended to be limiting thereof.

First Embodiment

Figure 2:
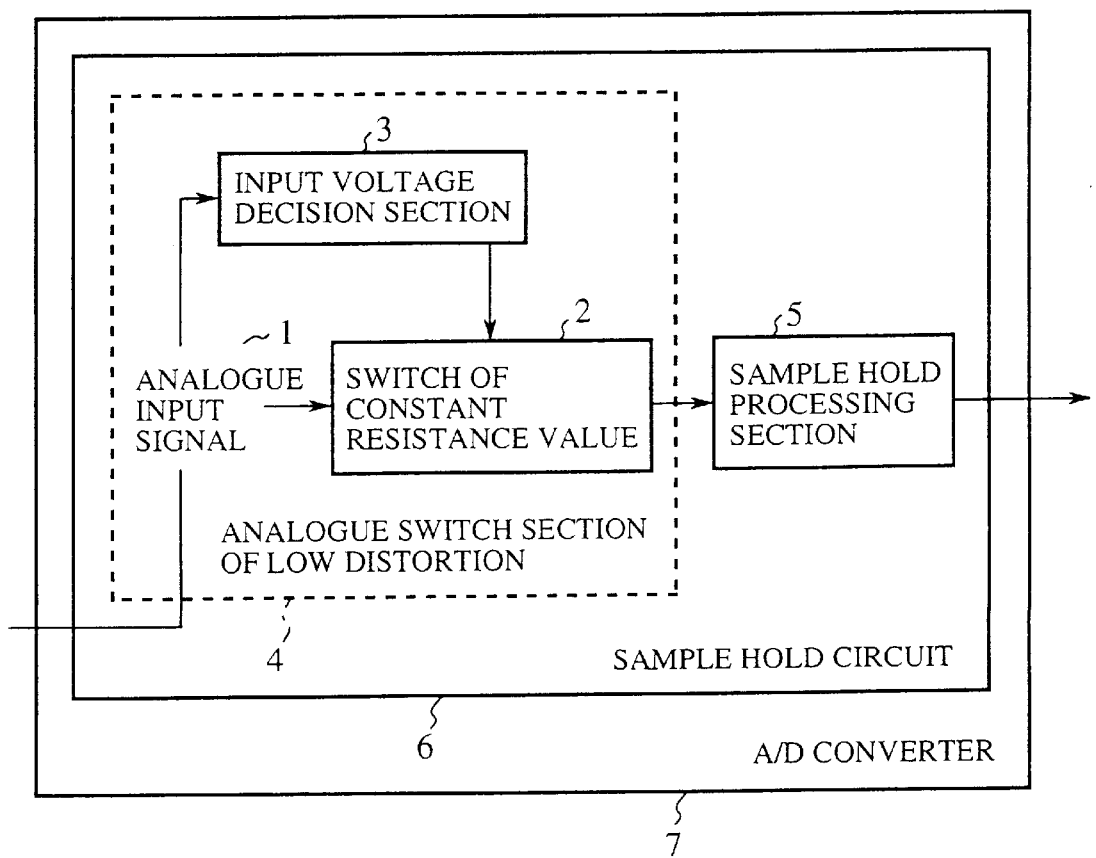
FIG. 2 is a block diagram showing an A/D converter incorporating a sample hold circuit according to the first to sixth embodiments of the present invention.

FIG. 2 is a block diagram showing an analogue to digital (A/D) converter incorporating a sample hold circuit according to first to sixth embodiments of the present invention. In FIG. 2, the reference number 7 designates the A/D converter. The reference number 6 designates the sample hold circuit, 4 denotes an analogue switch section of a low distortion, and 5 indicates a sample hold processing section. The analogue switch section 4 of a low distortion comprises an input voltage decision section 3 and a switch 2 of a constant resistance value. The sample hold processing section 5 receives an output signal from the switch 2 of a constant resistance value in the analogue switch 4 of a low distortion and then executes a sample hold processing. The sample hold circuit 6 comprises the analogue switch section 4 of a low distortion and the sample hold processing section 5. Thus, the A/D converter 7 includes the sample hold circuit 6.

Figure 3:
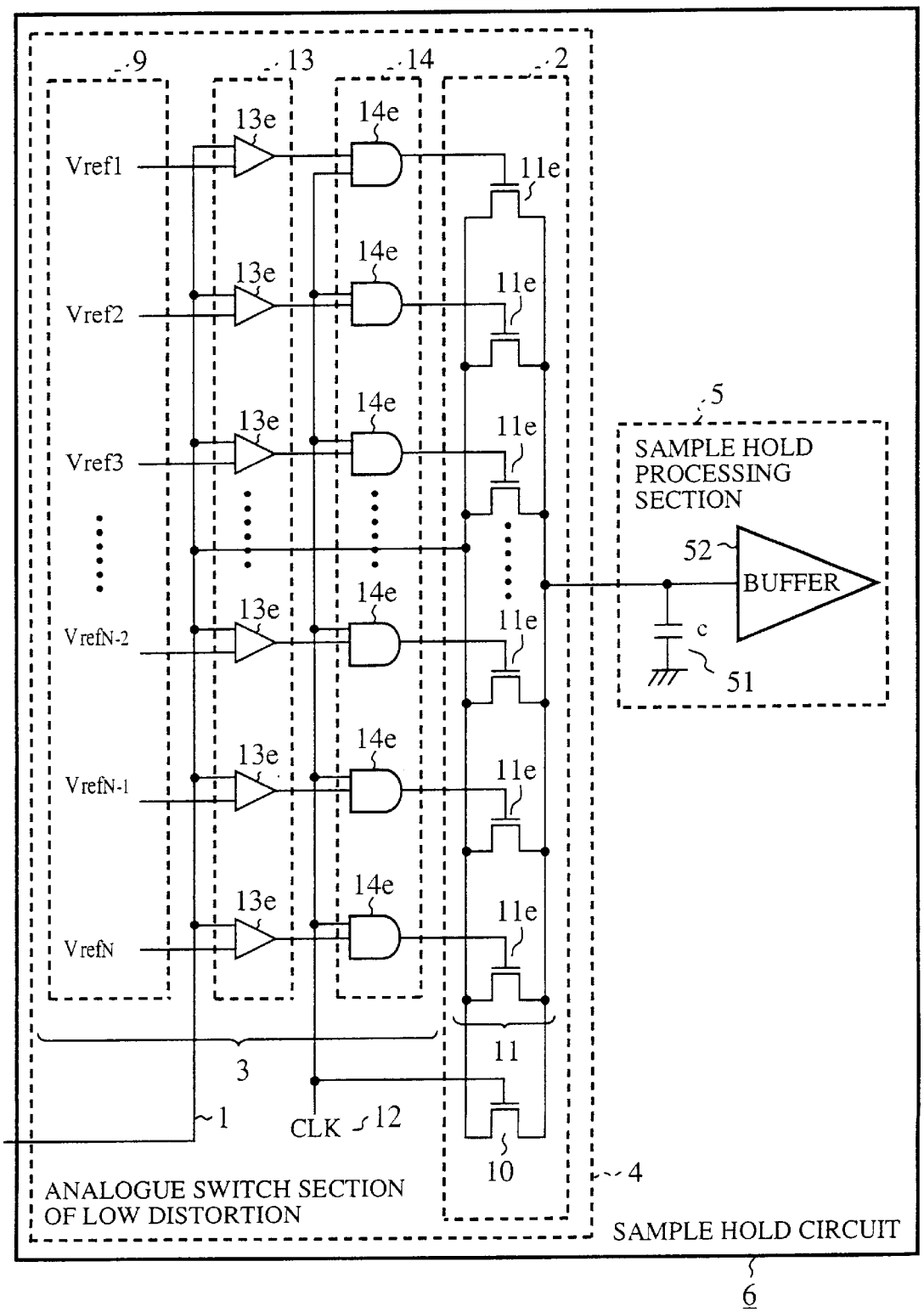
FIG. 3 is a circuit diagram showing a detailed configuration of the sample hold circuit incorporated in the A/D converter shown in FIG. 2 according to the first embodiment of the present invention.

FIG. 3 is a circuit diagram showing a detailed configuration of the sample hold circuit 6 incorporated in the A/D converter 7 shown in FIG. 2 as the first embodiment according to the present invention. As shown in FIG. 3, the input voltage decision section 3 in the sample hold circuit 6 comprises a reference voltage system 9 made up of plural rudder resistances, a comparison block section 13, and a switch off block 14.

The reference voltage system 9 supplies a plurality of reference voltages VrefN (N is a positive integer) whose number is a predetermined number to the comparison block 13. The number of the reference voltages VrefN is determined based on a system to which the A/D converter 7 is applied. That is to say, when the number of the reference voltages VrefN in the reference voltage system 9 is determined based on the range of an allowed change of the ON resistance to the range of an allowed distortion of the switch.

In order to satisfy the range of the allowed change of the ON resistance, the size of each switch and the number of the reference voltages VrefN (namely, the number of the comparison circuits 13e and the number of the unit switches 11e shown in FIG. 3) are determined.

Each comparison circuit 13e forming the comparison block 13 is incorporated corresponding to each reference voltage VrefN. The switch off block 14 comprises logical elements 14e performing a logical AND operation between the comparison result from the comparison block 13 and the clock signal CLK. Each logical element 14e is also incorporated corresponding to each comparison circuit 13e. Each logical element 14e in the switch off block 14 supplies the result of the logical AND operation to the switch 2 of a constant resistance value.

The switch 2 of a constant resistance value comprises a base switch 10 and a unit switch system 11 made up of plural n channel unit switches 11e. The sample hold processing section 5 comprises a hold capacitor 51 and a buffer circuit 52.

Next, a description will be given of the operation of the sample hold circuit 6 as the first embodiment.

First, an analogue input signal 1 supplied from outside to the A/D converter 7 is compared with the reference voltages VrefN as a reference signal in the input voltage decision section 3 in the analogue switch of a low distortion 4. The comparison results from the comparison circuits 13e are supplied to the corresponding AND circuits 14e in the switch off block 14. That is to say, the level of the voltage of the analogue input signal 1 is compared with each reference voltage VrefN (N is a positive integer) supplied from the reference voltage system 9 made up of the rudder resistances to the comparison block 13 including the comparison circuits 13e arranged corresponding to each reference voltage VrefN.

The comparison results in the comparison circuits 13e in the comparison block 13 are transferred to the switch off block made up of the AND circuits 14e. Each AND circuit 14e executes the logical AND operation between the comparison result from each comparison circuit 13e and the clock signal CLK 12 and transfers the operation result to the switch 2 of a constant resistance value.

Because each comparison result from the comparison block 13 is transferred to a gate terminal G in each unit switch 11e in the unit switch system 11 forming the switch 2 of a constant resistance value, the number of the unit switches 11e in an ON state (that is activated) is changed corresponding to the level of the voltage of the analogue input signal 1.

In order to set the switch 2 of a constant resistance value to an OFF state, that is to say, to set the base switch 10 and all of the unit switch 11e to the OFF state, it is required to execute the logical AND operation between each output from each comparison circuit 13e in the comparison block 13 and the clock signal CLK.

The switch 2 of a constant resistance value processes so that the ON resistance R of each unit switch 11e has a constant value according to the result of the logical AND operation supplied from each AND circuit 14e in the switch off block 14 even if the level of the voltage of the analogue input signal 1 is changed. The operation result of the analogue input signal 1 is transferred from the switch 2 to the sample hold processing unit 5.

The distortion of the output signal generated by the sample hold processing for the analogue input signal 1 executed by the sample hold processing section 5 can be decreased based on the processing by the switch 2 of a constant resistance value. 10 FIG. 9 is an explanation diagram showing the clock signal CLK 12 to be supplied to the analogue switch section 4 of a low distortion.

When the level of the clock signal CLK 12 is a High level (H level), the analogue switch section 4 of a low distortion enters the ON state. On the other hand, when the level of the clock signal CLK 12 is a Low level (L level), the analogue switch section 4 of a low distortion enters the OF state.

When the clock signal CLK 12 is the L level, that is to say, when the analogue switch section 4 of a low distortion enters the OFF state, the base switch 10 and all of the unit switches 10e in the switch 2 of a constant resistance value enter the OFF state.

Figure 4:
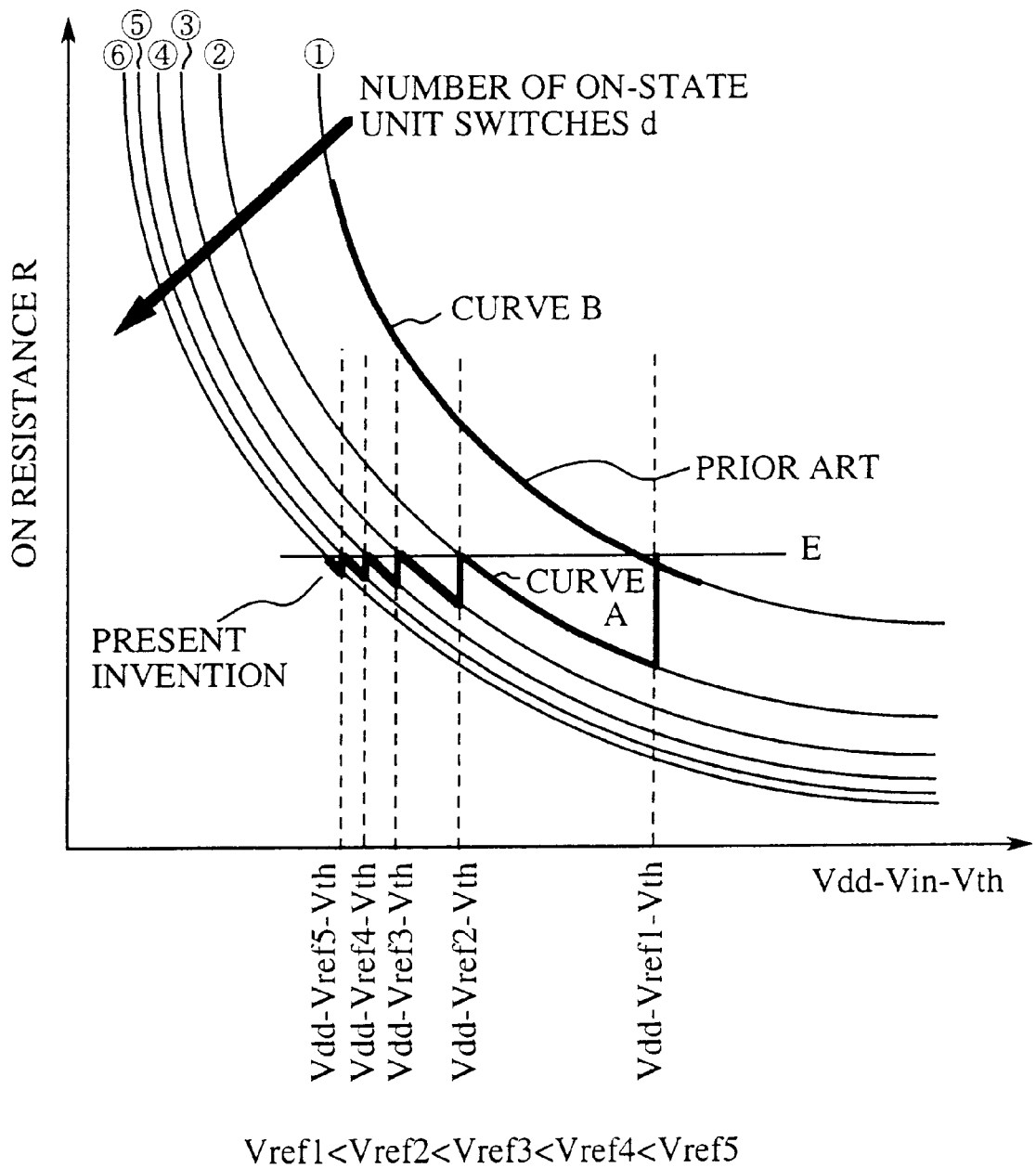
FIG. 4 is an explanation diagram showing the dependency of an ON resistance R of a switch of a constant resistance value (as a size variable switch) on the level of a voltage of an analogue input signal in the first embodiment of the present invention.

FIG. 4 is an explanation diagram showing the dependency of the ON resistance R of the switch 2 of a constant resistance value as a size variable switch on the level of the voltage of the analogue input signal 1, in the first embodiment of the present invention. The switch 2 of a constant resistance value as the size variable switch comprises the base switch 10 and the unit switches 11e as the first embodiment according to the present invention.

In the following explanation of the operation of the sample hold circuit 6 as the first embodiment, it is assumed that the clock signal CLK 12 is the H level, that is to say, the analogue switch section 4 of a low distortion enters ON.

The voltage of the clock signal CLK 12 is a voltage Vdd when the clock signal CLK 12 to be supplied to the gate terminal G of a MOS transistor forming each of the unit switches 11e and the base switch 10 is the H level. A threshold value of the MOS transistor forming each of the base switch 10 and the unit switches 11e is Vth. Those MOS transistors have same parameters such as $\mu$, $\epsilon$, tox, W, L and the like to determine the parameter $\beta$. The characteristic value Vth and those variable parameters $\beta$, $\mu$, $\epsilon$, tox, W, L and the like are the same values indicating the I–V characteristic of a MOS transistor. Therefore the detailed explanation for the parameters are omitted here.

The curves ① to ⑥ in FIG. 4 show the dependency of the ON resistance R of the switch 2 on the level of the voltage of the analogue input signal 1. The reference symbol ① designates a state where only the base switch 10 is ON. The reference symbol ② denotes a state where one unit switch 11e and the base switch 10 are ON. The reference symbol ③ indicates a state where two unit switches 11e and the base switch 10 are ON. The reference symbol ④ designates a state where three unit switches 11e and the base switch 10 are ON. The reference symbol ⑤ denotes a state where four unit switches 11e and the base switch 10 are ON. The reference symbol ⑥ indicates a state where five switches 11e and the base switch 10 are ON. In each unit switch 11e in the switch 2 of a constant resistance value has a same parameter $\beta$.

In order to set a synthetic ON resistance R of the MOS switches 10 and 11e to a constant value, each reference voltage VrefN is weighted during the comparison operation between the input voltage of the analogue input signal 1 and the reference voltage system 9 by using the following manner.

For example, when the level of the voltage Vin of the analogue input signal 1 is in a range from the reference voltage Vref 1 to the reference voltage Vref 2, the base switch 10 and one of the unit switches 11e in the unit switch system 11 are ON. In this case, the ON resistance of the switch 2 is changed along the curve ② shown in FIG. 4.

Moreover, when the level of the voltage Vin of the analogue input signal 1 is in a range from the reference voltage Vref 2 to the reference voltage Vref 3, the base switch 10 and two unit switches 11e in the unit switch system 11 are ON. In this case, the ON resistance of the switch 2 is changed along the curve ③ shown in FIG. 4.

Similar to the above operations, when the level of the voltage Vin of the analogue input signal 1 is changed from the reference voltage Vref 1 to the reference voltage Vref 5, the change of the ON resistance of the switch is change along the curve A.

Figure 1:
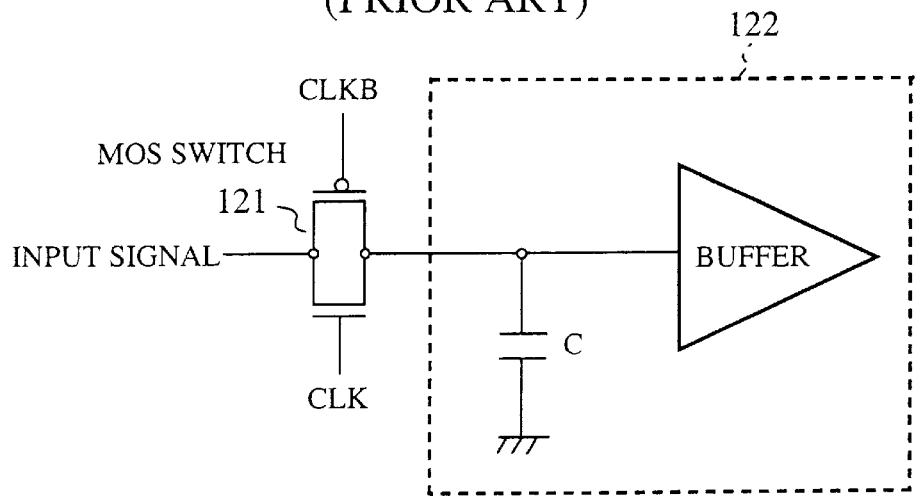
FIG. 1 is a circuit diagram showing a conventional sample hold circuit.

On the other hand, because the conventional A/D converter comprising only one base MOS switch 121 shown in FIG. 1, the ON resistance R of the MOS switch 121 is changed along the curve B when the level of the voltage Vin of the analogue input signal 1 is changed in a range from the reference voltage Vref 1 to the reference voltage Vref 5.

As apparently shown in FIG. 4, the curve A indicating the case of the present invention shows the low dependency on the input voltage of the analogue input signal 1 when compared with the curve B indicating the case of the conventional example. That is to say, the sample hold circuit of the present invention can decrease the change of the dependency of the ON resistance of the switch 2 as the size variable switch on the input voltage of the analogue input signal 1 when compared with the conventional case.

FIG. 3 shows the configuration of the sample hold processing section 5 comprising the hold capacitor 51 and the buffer circuit 52 where the hold capacitor 51 and the buffer 52 are placed in parallel to the analogue input signal 1. However, it is possible to form the sample hold processing section 5 where the hold capacitor 51 and the buffer 52 are placed in series to the analogue input signal 1 (as a series connection of a capacitor).

As described above, in the sample hold circuit according to the first embodiment of the present invention, the plural difference reference voltages VrefN are used, and the number of the unit switches 11e that are ON is changed according to the level of the voltage of the analogue input signal 1. That is to say, each of the unit switches 11e can enter the ON state according to the comparison result of the comparison circuits 13e based on the voltage value of the analogue input signal 1. Accordingly, the sample hold circuit of the first embodiment has the effect to suppress the dependency of the ON resistance on the level of the voltage of the analogue input signal 1.

Second Embodiment

The configuration of the A/D converter including the sample hold circuit as the second embodiment of the present invention is the same configuration of the A/D converter 7 including the sample hold circuit 6 as the first embodiment, therefore the same reference numbers shown in FIGS. 2 and 3 are used.

Next, a description will be given of the operation of the sample hold circuit as the second embodiment.

The levels of the reference voltages VrefN forming the reference voltage system 9 in the sample hold circuit as the first embodiment are weighted, that is to say, the voltage difference between adjacent reference voltages is changed.

On the other hand, the voltage difference between adjacent reference voltages is a constant in the sample hold circuit as the second embodiment. The MOS transistor forming each unit switch 11e has a different parameter β, that is to say, each MOS transistor is weighted.

Figure 5:
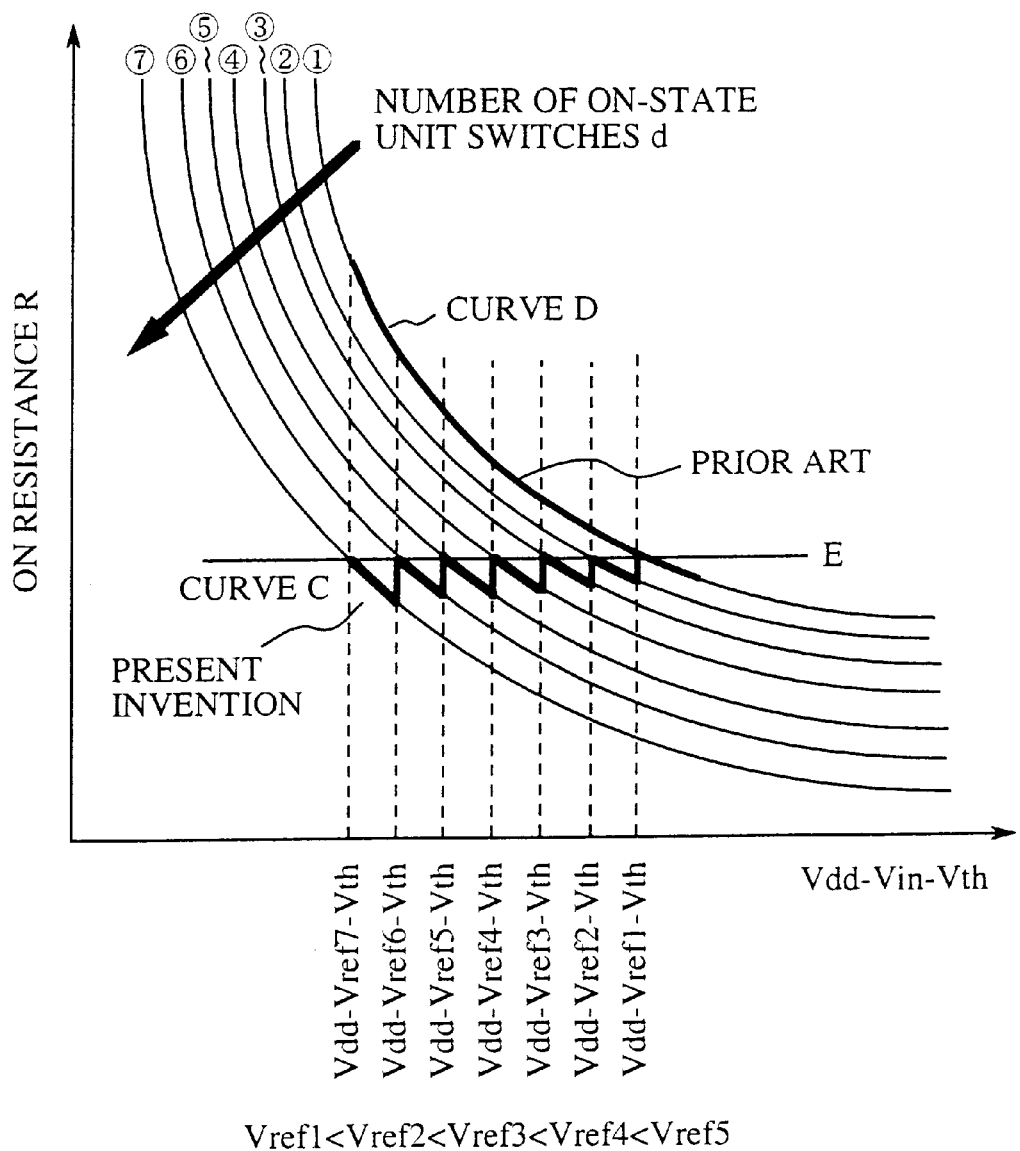
FIG. 5 is an explanation diagram showing the dependency of an ON resistance R of a switch of a constant resistance value (as a size variable switch) on the level of a voltage of an analogue input signal in the second embodiment of the present invention.

FIG. 5 is an explanation diagram showing the dependency of the ON resistance R of the switch 2 of a constant resistance value as a size variable switch on the level of the voltage of the analogue input signal 1, in the second embodiment of the present invention. The switch 2 of a constant resistance value as the size variable switch comprises the base switch 10 and the unit switches 11e.

In the sample hold circuit as the second embodiment, the parameter β of the MOS transistor in each unit switch 11e forming the unit switch system 11 is weighted so that the dependency of the ON resistance of the switch 2 of a constant resistance value as the size variable switch on the voltage of the analogue input signal 1 is decreases as small as possible. In addition, the voltage difference between adjacent reference voltages is the same value.

The curves ① to ⑦ in FIG. 5 show the dependency of the ON resistance R of the switch 2 on the level of the voltage of the analogue input signal 1. The reference symbol ① designates a state where only the base switch 10 is ON. The reference symbol ② denotes a state where one unit switch lie and the base switch 10 are ON. The reference symbol ③ indicates a state where two unit switches 11e and the base switch 10 are ON. The reference symbol ④ designates a state where three unit switches 11e and the base switch 10 are ON. The reference symbol ⑤ denotes a state where four unit switches 11e and the base switch 10 are ON. The reference symbol ⑥ indicates a state where five switches 11e and the base switch 10 are ON. The reference symbol ⑦ indicates a state where six switches 11e and the base switch 10 are ON. Each unit switch 11e in the switch 2 of a constant resistance value has a weighted parameter β.

For example, when the level of the voltage Vin of the analogue input signal 1 is in a range from the reference voltage Vref 1 to the reference voltage Vref 2, the base switch 10 and one of the unit switches 11e having different parameters β in the unit switch system 11 are ON. In this case, the ON resistance of the switch 2 is changed along the curve ② shown in FIG. 5.

Moreover, when the level of the voltage Vin of the analogue input signal 1 is in a range from the reference voltage Vref 2 to the reference voltage Vref 3, the base switch 10 and two unit switches 11e having different parameters β in the unit switch system 11 are ON. In this case, the ON resistance of the switch 2 is changed along the curve ③ shown in FIG. 5.

Similar to the above operations, when the level of the voltage Vin of the analogue input signal 1 is changed from the reference voltage Vref 1 to the reference voltage Vref 7, the change of the ON resistance of the switch 2 is change along the curve C.

On the other hand, because the conventional A/D converter comprises only one base MOS switch 121 shown in FIG. 1, the ON resistance R of the MOS switch 121 is changed along the curve D when the level of the voltage Vin of the analogue input signal 1 is changed in a range from the reference voltage Vref 1 to the reference voltage Vref 7.

As apparently shown in FIG. 5, the curve C indicating the case of the present invention shows the low dependency on the input voltage of the analogue input signal 1 when compared with the curve D indicating the case of the conventional example. That is to say, the sample hold circuit as the second embodiment of the present invention can decrease the change of the dependency of the ON resistance of the size variable switch on the input voltage of the analogue input signal 1 when compared with the conventional case comprising only the base switch 121.

As described above, the sample hold circuit according to the second embodiment of the present invention has the same effect obtained by the sample hold circuit as the first embodiment. In addition, a sample hold circuit formed by combining both the configurations of the first and second embodiments further reduce the dependency of the ON resistance of the switch 2 of a constant resistance value as the size variable switch on the input voltage of the analogue input signal 1.

Third Embodiment

Figure 6:
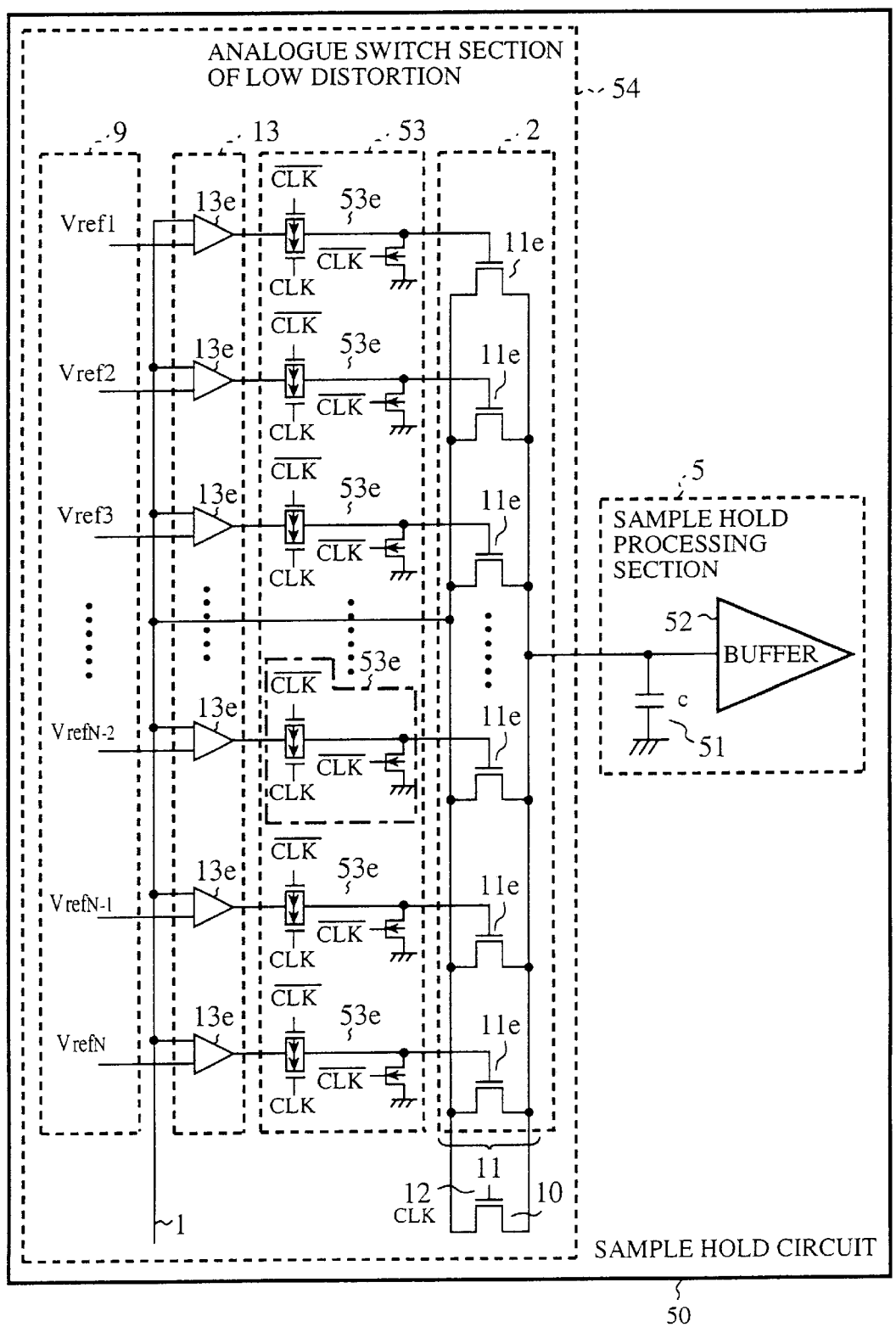
FIG. 6 is a circuit diagram showing a sample hold circuit according to the third embodiment of the present invention.

FIG. 6 is a circuit diagram showing a sample hold circuit as the third embodiment according to the present invention.

In FIG. 6, the reference number 50 designates the sample hold circuit of the third embodiment, 54 indicates an analogue switch of a low distortion, and 53 indicates a switch off block.

The switch off block 53 has the function to halt the operation of the analogue switch section 54 of a low distortion. The switch off block 14 in the sample hold circuit as the first and second embodiments comprises plural logical AND circuits 14e. It is required to use six MOS transistors in order to form the switch off block 14 in the sample hold circuit as the first and second embodiments by using NAND circuits and inverter circuits.

On the other hand, each block 53e forming the switch off block 53 in the sample hold circuit 50 as the third embodiment can comprise only three MOS transistors (as selection circuits) in order to further reduce the size of the analogue switch section 54 of a low distortion. Other components are same as the components in the sample hold circuit as the first embodiment and the second embodiment, therefore the same reference numbers are used for the same components.

Next, a description will be given of the operation of the sample hold circuit as the third embodiment.

Each block 53e in the switch off block 53 operates based on both the clock signal CLK and the inverted clock signal/CLK having the inverted level of the clock signal CLK. Those clock signal CLK and the clock signal/CLK to be supplied to each block circuit 53e in the switch off block 53 are the same signals of the clock signal CLK and the inverted clock signal/CLK shown in FIG. 9.

When the clock signal CLK is the H level, the output signal as the comparison result of each comparison circuit 13e is supplied to the gate terminal G of the MOS transistor in each unit switch 11e. When the clock signal CLK is the L level, the ground voltage 0V is supplied to the gate terminal G of the MOS transistor in each unit switch 11e. The following operations are the same as the operations in the first and second embodiments.

As described above, because each block 53e forming the switch off block 53 in the analogue switch section 54 of a low distortion in the sample hold circuit as the third embodiment comprises three MOS transistors, it is possible to reduce the size of the analogue switching section 54 of a low distortion and thereby further reduce the size of the sample hold circuit.

Fourth Embodiment

Figure 7:
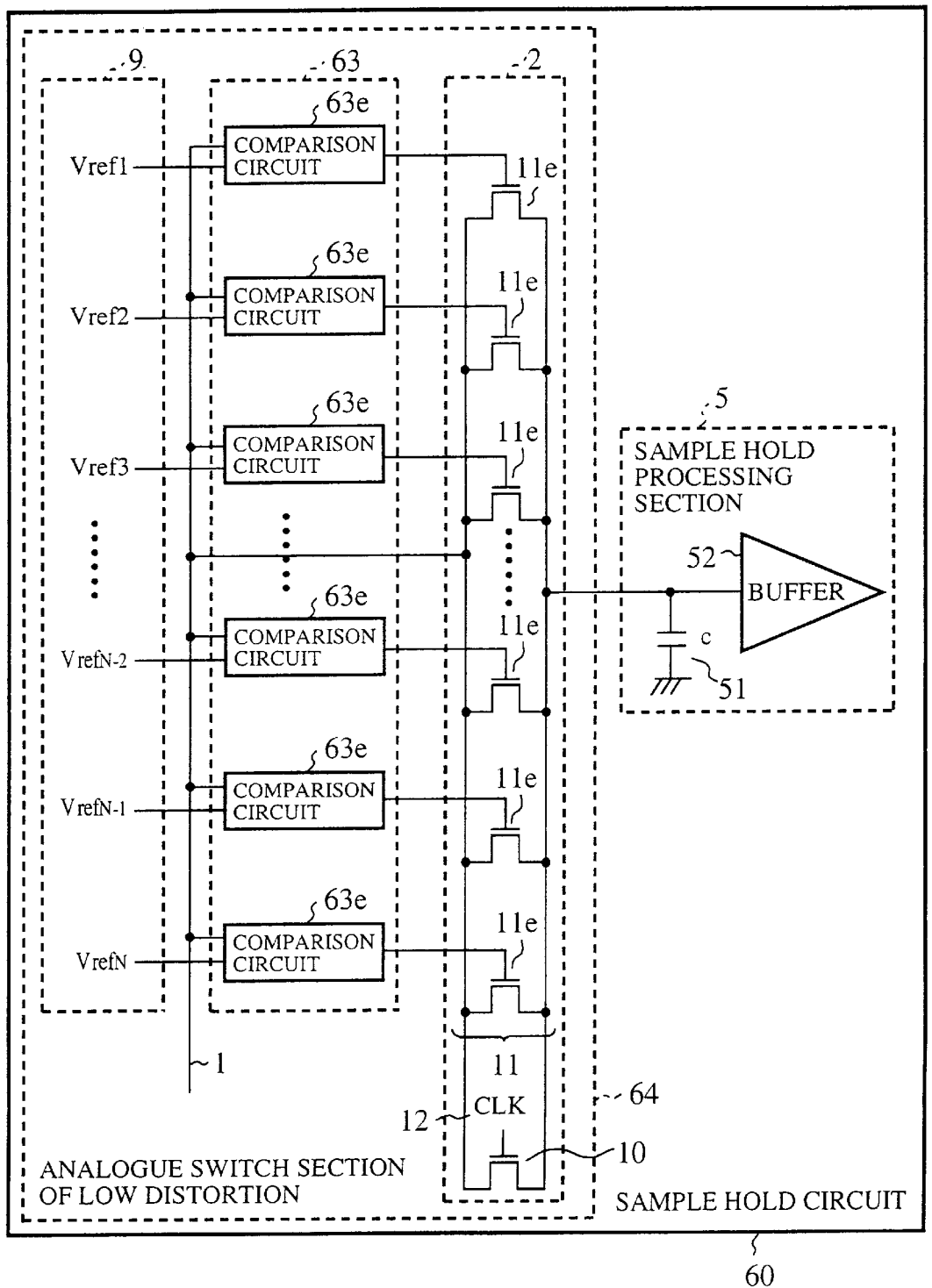
FIG. 7 is a circuit diagram showing a sample hold circuit according to the fourth and fifth embodiments of the present invention.

FIG. 7 is a circuit diagram showing a sample hold circuit as the fourth and fifth embodiments according to the present invention. In FIG. 7, the reference number 60 designates the sample hold circuit as the third embodiment, 64 indicates an analogue switch section of a low distortion, 63 denotes a comparison block. Each comparison circuit 63e in the comparison block 63 has the configuration where the function of the switch off blocks 14 and 53 of the first to third embodiments are incorporated in the comparison block 63. Each comparison circuit 63e forming the comparison block 63 comprises a differential amplifier.

Figure 8A:
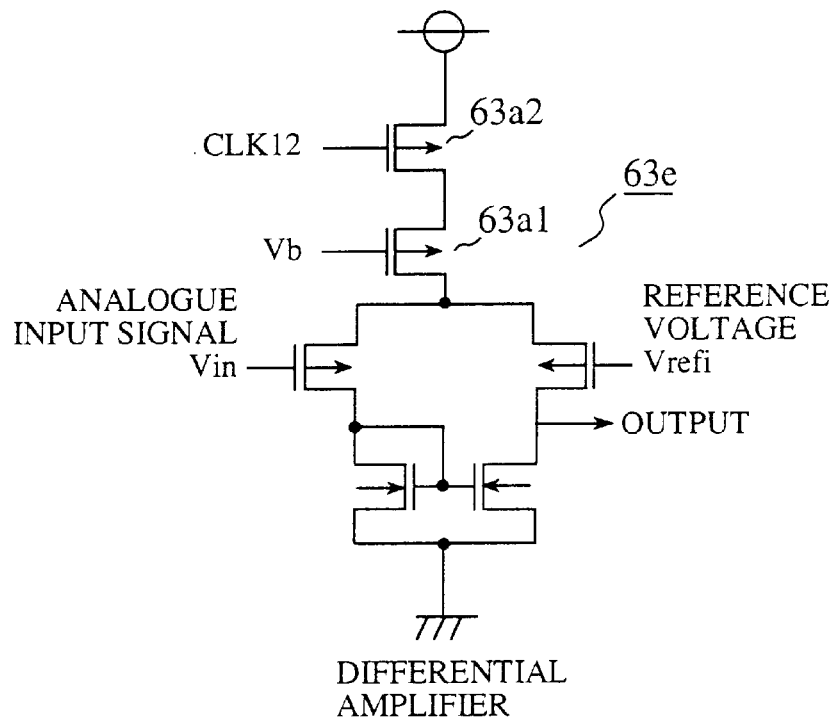
FIG. 8A is a circuit diagram of a differential amplifier as each comparison circuit in a comparison block.
Figure 8B:
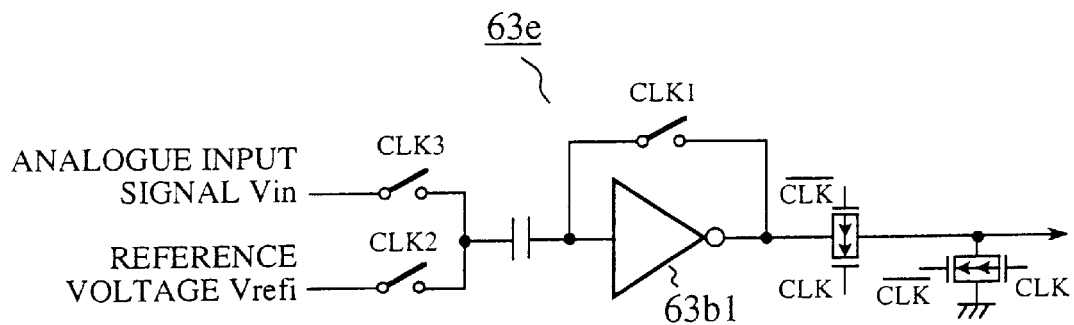
FIG. 8B is a circuit diagram of a chopper type comparison circuit as each comparison circuit in the comparison block.

FIGS. 8A and 8B are circuit diagrams of the comparison circuit. FIG. 8A shows a configuration of the differential amplifier. FIG. 8B shows a configuration of a chopper type comparison circuit. The function of chopper type comparison circuit will be described in the fifth embodiment.

Next, a description will be given of the operation of the sample hold circuit as the fourth embodiment.

In the sample hold circuit 60 as the fourth embodiment, the function of the switch off block is incorporated in the comparison block 63 in order to further reduce the size and the power consumption of the analogue switch section 64 of a low distortion when compared with the sample hold circuits as the first to third embodiments. Thereby, the sample hold circuit 60 as the fourth embodiment further reduces the size when compared with the size of the sample hold circuit as the first to third embodiments. Each comparison circuit 63e forming the comparison block 63 is made up of the differential amplifier shown in FIG. 8A. A constant current source 63a1 in the differential amplifier is connected to a MOS transistor 63a2 in series.

In the differential amplifier forming each comparison circuit 63e in the comparison block 63, no current flows through the constant current source 63a1 because the level of the clock signal CLK 12 (that is supplied to the gate terminal G of the MOS transistor 63a2 connected to the constant current source 63a1 in series) is the L level while the clock signal CLK 12 is the L level and the analogue switch section 64 of a low distortion enters the OFF state. Thereby, the power consumption of each comparison circuit 63e can be further reduced while the clock signal CLK 12 is the L level and the analogue switch section 64 of a low distortion enters the OFF state.

As described above, according to the sample hold circuit as the fourth embodiment of the present invention, the layout area of the switch off block and the size of the sample hold circuit can be reduced because the functions of the switch off blocks in the first to third embodiments are incorporated into each comparison circuit 63e in the comparison block 63 in the analogue switch section 64. In addition, the differential amplifier forming each comparison circuit 63e can cut a current flowing through the differential amplifier during the OFF state of the analogue switch section 64 of a low distortion and thereby reduce the power consumption.

Fifth Embodiment

The sample hold circuit as the fifth embodiment has the same configuration of the fourth embodiment shown in FIG. 7. In the fifth embodiment, each comparison circuit 63e forming the comparison block 63 comprises a chopper type comparison circuit shown in FIG. 8B. Other components are the same as the components in the sample hold circuit as the fourth embodiment, therefore the same reference numbers are used for the same components.

Next, a description will be given of the operation of the sample hold circuit as the fifth embodiment.

In the sample hold circuit 60 as the fifth embodiment, the function of the switch off block is incorporated in the comparison block 63 in order to further reduce the size and the power consumption of the analogue switch section 64 of a low distortion when compared with the sample hold circuits as the first to third embodiments. Thereby, the sample hold circuit 60 as the fifth embodiment further reduces the size when compared with the size of the sample hold circuit as the first to third embodiments. Each comparison circuit 63e forming the comparison block 63 is made up of the chopper type comparison circuit shown in FIG. 8B.

FIG. 10 is an explanation diagram showing control clock signals CLK, CLK1, CLK2, CLK3 to control the operation of the chopper type comparison circuit.

As shown in FIG. 10, the chopper type comparison circuit is performed based on the control clock signals CLK, CLK 1, CLK 2, and CLK 3 so that the auto-zero period of the inverter 63b1 (that operates the auto-zero operation) is reduced while the analogue switch section 64 of a low distortion enters the OFF state. That is to say, the operation of the chopper type comparison circuit is so controlled that the period during the H level of the clock signal CLK 1 for the auto-zero is reduced.

As described above, according to the sample hold circuit as the fifth embodiment of the present invention, the layout area of the switch off block and the size of the sample hold circuit can be reduced because the functions of the switch off blocks in the first to third embodiments are incorporated into each comparison circuit 63e in the comparison block 63 in the analogue switch section 64 of a low distortion. In addition, the chopper type comparison circuit forming each comparison circuit 63e can cut a current flowing through the chopper type comparison circuit during the ON state of the analogue switch section 64 of a low distortion and thereby reduce the power consumption. Moreover, the power consumption can be further reduced by reducing the period of a penetrate current flowing through the inverter 63b1 in the chopper type comparison circuit during the OFF state of the analogue switch section 64 of a low distortion.

Sixth Embodiment

In each sample hold circuit as the first to fifth embodiments, a n-channel MOS transistor is used in each unit switch 11e forming the unit switch system 11, and the comparison circuits in the comparison block and the switch off block are formed in order to match the function of the n-channel MOS transistor.

Figure 11:
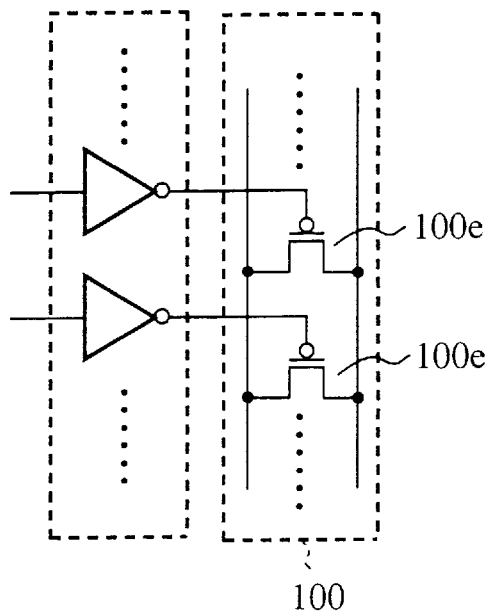
FIG. 11 is a block diagram showing a unit switch series incorporated in a sample hold circuit according to the sixth embodiment of the present invention.

FIG. 11 is a block diagram showing a unit switch series incorporated in the sample hold circuit as the sixth embodiments of the present invention. In FIG. 11, the reference number 100 designates the unit switch system, and 100e denotes a p-channel MOS transistor as a unit switch forming the unit switch system. As omitted from FIG. 11, the base switch is formed by using the p-channel MOS transistor.

Figure 12:
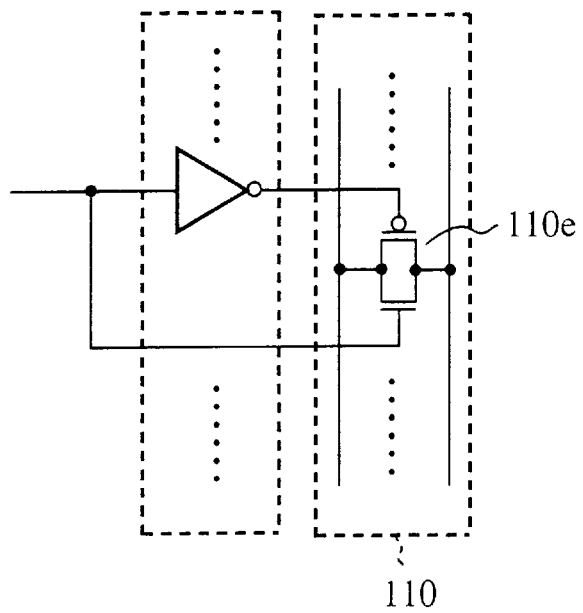
FIG. 12 is a block diagram showing a unit switch series incorporated in a sample hold circuit according to the sixth embodiment of the present invention.

FIG. 12 is a block diagram showing a unit switch series incorporated in the sample hold circuit as the sixth embodiments of the present invention. In FIG. 12, the reference number 110 designates the unit switch system, and 110e denotes a CMOS transistor as a unit switch forming the unit switch system. As omitted from FIG. 11, the base switch is formed by using the CMOS transistor.

As shown in both FIG. 11 and FIG. 12, the p-channel MOS transistor or the CMOS transistor is used as the unit switch 100e forming the unit switch system 100, and the comparison circuits in the comparison block and the switch off block are formed in order to match the function of the n-channel MOS transistor or the CMOS transistor. Other components such as the reference voltage system, the comparison block, the switch off clock are the same of those components in the sample hold circuit as the first to fifth embodiments, therefore the same reference numbers are used for the same components, and the explanation for them is omitted here.

Next, a description will be given of the operation of the sample hold circuit as the sixth embodiment.

When each transistor forming the base switch 10 and the unit switch system 100 and 110 is the p-channel MOS transistor, an inverter is connected to the base terminal of the p-channel MOS transistor. In this case, the MOS transistor having the small magnitude of the threshold voltage and the small dependency on the input voltage of the analogue input signal is used as the unit switch in the unit switch system in order to obtain higher effect based on a comparison result where the magnitude of the threshold voltage Vth of the p-channel MOS transistor and the n-channel MOS transistor and its dependency on the input voltage of the analogue input signal 1 are compared.

In addition, in a case that the p-channel MOS transistor shown in FIG. 11 is used as the unit switch, the sample hold circuit has a higher effect when the input signal whose voltage is similar in level to the clock signal CLK to be supplied to the gate terminal G of the unit switch in the ON state is used, that is to say, when the input signal in a region where the ON resistance R of the p-channel MOS transistor as the unit switch cab be reduced is used.

As described above, in the sample hold circuit according to the sixth embodiment of the present invention, the p-channel MOS transistor or the CMOS transistor is used as each unit switch in the base switch and the unit switch system. This configuration can obtain the same effects of the first and fifth embodiments.

As described above in detail, in the sample hold circuit according to the present invention, a plurality of reference voltages each having a different voltage are supplied, the number of the unit switches in the ON state (in the activated state) is increased corresponding to increasing of the number of the reference voltages that are not more than the voltage of the analogue input voltage. It is therefore possible to increase the number of the unit switches according to the level of the analogue input signal. Thereby, the sample hold circuit of the present invention is capable of relaxing the dependency of the ON resistance of the switch on the voltage of the analogue input signal.

In addition, according to the present invention, because each block forming the switch off block in the analogue switch section of a low distortion is made up of a MOS transistor (selection circuit), it is thereby possible to decrease the size of the analogue switch section of a low distortion and also to decrease the size of the sample hold circuit.

Moreover, according to the present invention, because each comparison circuit forming the comparison block in the analogue switch section of a low distortion incorporates the function of the switch off block, it is thereby possible to decrease the size of the sample hold circuit. Furthermore, when the comparison circuit is made up of a differential amplifier or a chopper type comparison circuit, it is possible to cut a constant current flowing through the differential amplifier during the OFF state of the analogue switch section of a low distortion, and to reduce the power consumption of the chopper type comparison circuit as the selection circuit during the ON state of the analogue switch section of a low distortion, and to reduce the power consumption of a penetrate current flowing through an inverter in the chopper type comparison circuit during the OFF state of the analogue switch section of a low distortion.

Furthermore, according to the present invention, even if each of the base switch and the unit switches is made up of one of a p-channel type MOS transistor and a CMOS transistor instead of a n-channel type MOS transistor, the sample hold circuit can obtain the same effect described above.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A sample hold circuit comprising:
   an input voltage decision section for comparing an analogue input signal with each reference signal having a predetermined voltage;
   a switch of a constant resistance value for receiving said analogue input signal and a decision result from said input voltage decision section and for processing said analogue input signal so that an ON resistance has a constant value in spite of a level of an input voltage of said analogue input signal according to the decision result from said input voltage decision section; and a sample hold processing section for sampling said analogue input signal from said switch.

2. A sample hold circuit according to claim 1, wherein said input voltage decision section comprises:

a reference voltage system for generating and supplying a plurality of reference voltages each having a predetermined voltage;

a comparison block comprising a plurality of comparison circuits, corresponding to said plurality of reference voltages, for comparing said analogue input signal with said plurality of reference voltages; and a switch off block comprising a plurality of blocks corresponding to said plurality of reference voltages, said switch of the constant resistance value comprising a base switch and a plurality of unit switches corresponding to said plurality of comparison circuits, wherein each of said plurality of reference voltages is weighted, said plurality of comparison circuits compare said input voltage said analogue input signal with said plurality of reference voltages when said switch of the constant resistance value enters ON, and said plurality of unit switches are selectively activated by supplying output signals, obtained by logical AND operation between said comparison results from said plurality of comparison circuits and a clock signal to be supplied to said switch, to a gate terminal of each unit switch so that a synthetic ON resistance of an ON resistance of said base switch and ON resistances of said plurality of unit switches becomes a constant value according to said input voltage of said analogue input signal.

3. A sample hold circuit according to claim 2, wherein each of said plurality of blocks forming said switch off block comprises a selection circuit made up of a MOS transistor, and an ON/OFF operation of each unit switch forming said switch of the constant resistance value is performed based on an output signal from each selection circuit.

4. A sample hold circuit according to claim 3, wherein each unit switch forming said plurality of unit switches is made up of one of an n-channel type MOS transistor, a p-channel type MOS transistor, and a CMOS transistor.

5. A sample hold circuit according to claim 2, wherein said comparison block and said switch off block in said input voltage decision section comprise a plurality of comparison circuits each comprising a differential amplifier or a chopper type comparison circuit, and said an ON/OFF operation of each unit switch forming said switch of the constant resistance value is performed based on an output signal from each comparison circuit.

6. A sample hold circuit according to claim 5, wherein each unit switch forming said plurality of unit switches is made up of one of an n-channel type MOS transistor, a p-channel type MOS transistor, and a CMOS transistor.

7. A sample hold circuit according to claim 2, wherein each unit switch forming said plurality of unit switches is made up of one of an n-channel type MOS transistor, a p-channel type MOS transistor, and a CMOS transistor.

8. A sample hold circuit according to claim 1, wherein said input voltage decision section comprises:

a reference voltage system for generating and supplying a plurality of reference voltages each having a predetermined voltage;

a comparison block comprising a plurality of comparison circuits, corresponding to said plurality of reference voltages, for comparing said analogue input signal with said plurality of reference voltages; and a switch off block comprising a plurality of blocks corresponding to said plurality of reference voltages, said switch of the constant resistance value comprising a base switch and a plurality of unit switches corresponding to said plurality of comparison circuits, wherein each of said plurality of unit switches is weighted, said plurality of comparison circuits compare said input voltage of said analogue input signal with said plurality of reference voltages when said switch of the constant resistance value enters ON, and said plurality of unit switches are selectively activated by supplying output signals, obtained by logical AND operation between said comparison results from said plurality of comparison circuits and a clock signal to be supplied to said switch, to a gate terminal of each unit switch so that a synthetic ON resistance of an ON resistance of said base switch and ON resistances of said plurality of unit switches becomes a constant value according to said input voltage of said analogue input signal.

9. A sample hold circuit according to claim 8, wherein each of said plurality of blocks forming said switch off block comprises a selection circuit made up of a MOS transistor, and an ON/OFF operation of each unit switch forming said switch of the constant resistance value is performed based on an output signal from each selection circuit.

10. A sample hold circuit according to claim 9, wherein each unit switch forming said plurality of unit switches is made up of one of an n-channel type MOS transistor, a p-channel type MOS transistor, and a CMOS transistor.

11. A sample hold circuit according to claim 8, wherein said comparison block and said switch off block in said input voltage decision section comprise a plurality of comparison circuits each comprising a differential amplifier or a chopper type comparison circuit, and said an ON/OFF operation of each unit switch forming said switch of the constant resistance value is performed based on an output signal from each comparison circuit.

12. A sample hold circuit according to claim 11, wherein each unit switch forming said plurality of unit switches is made up of one of an n-channel type MOS transistor, a p-channel type MOS transistor, and a CMOS transistor.

13. A sample hold circuit according to claim 8, wherein each unit switch forming said plurality of unit switches is made up of one of an n-channel type MOS transistor, a p-channel type MOS transistor, and a CMOS transistor.

14. A sample hold circuit according to claim 1, wherein said switch comprises a plurality of unit switches, each unit switch forming said plurality of unit switches is made up of one of an n-channel type MOS transistor, a p-channel type MOS transistor, and a CMOS transistor.

15. A sample hold circuit comprising:

a reference voltage system for supplying a plurality of reference voltages having difference voltages;

a plurality of comparison circuits corresponding to said plurality of reference voltages, for comparing an input voltage of an analog input signal with said plurality of reference voltages; and a switch including a plurality of unit switches corresponding to said plurality of comparison circuits, each unit switch being on in accordance with an output signal from the corresponding comparison switch, said switch further including a base switch being on irrespective of the output signals from said plurality of comparison circuits, said base switch and said plurality of unit switches connected in parallel between a first node receiving said analog input signal and a second node; and a sample hold processing unit connected to said second node, for sampling an output signal from said switch.

16. A sample hold circuit according to claim 15, wherein said switch being so constructed that synthetic ON resistance of one or more unit switches being on and said base switch becomes a constant value irrespective of the input voltage of said analog input signal.

17. A sample hold circuit according to claim 15, wherein said plurality of reference voltages are weighted.

18. A sample hold circuit according to claim 15, wherein ON resistance of said plurality of unit switches are weighted.

19. A sample hold circuit according to claim 15, wherein said input voltage decision section includes switch off blocks comprises a plurality of switch control circuits corresponding to said plurality of comparison circuits, each switch control circuit controlling to selectively supply the comparison result of the corresponding comparison circuit and a fixed potential to the corresponding unit switch in accordance with a clock signal, and said base switch is on in accordance with the clock signal.

* * * * *